(12) United States Patent
Scheying et al.

(10) Patent No.: US 6,518,323 B1
(45) Date of Patent: Feb. 11, 2003

(54) POLYMER COMPOUND, THE PRODUCTION AND USE THEREOF, AND SINTERED COMPACTS PRODUCED THEREFROM

(75) Inventors: Gerd Scheying, Stuttgart (DE); Johannes Kanters, Tönisvorst (DE); Ingrid Wuehrl, Gerlingen (DE); Ulrich Eisele, Stuttgart (DE); Horst Boeder, Sindelfingen (DE); Lutz Dorfmueller, Stuttgart (DE); Werner Gruenwald, Gerlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/622,018
(22) PCT Filed: Dec. 9, 1999
(86) PCT No.: PCT/DE99/03934
§ 371 (c)(1), (2), (4) Date: Oct. 11, 2000
(87) PCT Pub. No.: WO00/34204
PCT Pub. Date: Jun. 15, 2000

(30) Foreign Application Priority Data

Dec. 10, 1998 (DE) .......................................... 198 57 063
Dec. 2, 1999 (DE) .......................................... 199 58 197

(51) Int. Cl.$^7$ .................................................. C08J 9/00
(52) U.S. Cl. ........................................................ 521/50
(58) Field of Search ................................. 264/123, 126; 521/91, 92, 134, 142, 149, 182, 184

(56) References Cited

U.S. PATENT DOCUMENTS 6,087,024 A * 7/2000 Whinnery et al.
6,171,532 B1 * 1/2001 Sterzel
6,183,515 B1 * 2/2001 Barlow et al.

FOREIGN PATENT DOCUMENTS

| EP | 0 313 412 | 4/1989 |
| EP | 0 561 343 | 9/1993 |
| JP | 59 121151 | 7/1984 |
| WO | WO 92 07026 | 4/1992 |

* cited by examiner

Primary Examiner—Morton Foelak
(74) Attorney, Agent, or Firm—Kenyon & Kenyon

(57) ABSTRACT

A polymer compound containing a ceramic powder and a polymer is described, the ceramic powder having a specific surface area of more than $1.8 \cdot 10^8$ m$^2$/m$^3$ and constituting more than 5 vol. % of the polymer compound, the polymer being shear resistant, and the pore sizes in the polymer compound being 3–15 nm. Furthermore, a method for manufacturing this polymer compound, its use, and a sintered body manufactured therefrom are also described.

20 Claims, No Drawings

POLYMER COMPOUND, THE PRODUCTION AND USE THEREOF, AND SINTERED COMPACTS PRODUCED THEREFROM

FIELD OF THE INVENTION

The present invention relates to a polymer compound, manufacturing method and use thereof, and sintered bodies manufactured therefrom.

BACKGROUND INFORMATION

Ceramic Injection Molding (CIM) and extrusion represent two important methods for ceramic molding. In these processes a polymer compound must be initially manufactured by dispersion of ceramic particles in a high-viscosity polymeric matrix. The desired shape is obtained by processing such a mixture by ceramic injection molding or extrusion. After removing the organic auxiliary materials (debindering) a ceramic blank is obtained, which is compressed by sintering. In order for this sintering to result in a dense body, the content of ceramic solids in the blank must be sufficiently high, over 40% by volume, i.e., the polymer compound must also be filled at least 40% in this case.

Powders with particle sizes in the nanometer range are always present in the agglomerated form. The strength of the agglomerates, known as an agglomerate hardness, depends on the previous history of the powder. The spectrum ranges from Van der Waals interaction forces to hydrogen bridge bonds to true sintering necks. In order to reduce the tendency to agglomerate, the powder surfaces are protected with synthetic auxiliary materials. It is, however, considered a disadvantage in this case that no high temperatures can be used in producing the powder, so that the powders often still contain amorphous components. Furthermore, it is also considered disadvantageous that auxiliary materials interfere with subsequent processing.

In manufacturing ceramic blanks by extrusion or CIM and in producing highly filled plastics, normally powders whose specific surface area does not exceed 15 m$^2$/g are currently used. Thus, powders with a relatively low specific surface area are used. This is explained by the fact that finer powders tend to agglomerate to a relatively much higher degree and their agglomerate hardness and the related energy required for breaking up these powder agglomerates is also much higher when such breaking up is even possible.

There are however applications in which a large surface area of the fillers is desirable. Interactions between fillers and the surrounding matrix increase with increasing surface area/volume ratio. The desired properties of particle-filled plastics are defined by these interactions.

Zirconium dioxide powders can be sintered using powder metallurgy to obtain bodies with less than 5% porosity. This material contains tetragonal grains, a mixture of tetragonal, monoclinic, and cubic grains, or only monoclinic grains. The tetragonal phase is stabilized by a small particle size, by doping with foreign elements, high temperature, intrinsic pressure of the material structure, and external pressure. In the following, the small particle size is referred to as particle size stabilization and the intrinsic pressure of the material structure is referred to as structure stabilization. Zirconium dioxide having mixed phase components exhibits intrinsic stresses of the structure, which stabilize the tetragonal component.

These intrinsic stresses result in very high material strength. However, zirconium dioxide having mixed phase components could be previously produced only using more than 1 mol-% of doping materials, which is considered disadvantageous. Known doping materials include $Y_2O_3$, CaO, $CeO_2$, or MgO.

SUMMARY

The object of the present invention is to provide a polymer compound and a method for manufacturing it in which a dispersion of free nanocrystalline ceramic particles occurs.

This object is surprisingly achieved by a polymer compound containing a ceramic powder and a polymer, the powder having a specific surface area of more than $1.8 \cdot 10^8$ m$^2$/m$^3$ and constituting more than 5 vol. % of the polymer compound, the polymer being shear resistant, and the pore sizes in the polymer compound being 3–15 nm.

It is also the object of the present invention to arrive at a zirconium dioxide sintered body having a very high strength by using a polymer compound and no more than 0.8 mol % of doping substances.

DETAILED DESCRIPTION

This object is achieved by the fact that the ceramic powder in the polymer compound according to the present invention constitutes more than 40 vol. %.

In a particularly advantageous manner, a blank manufactured from this polymer compound according to the present invention can be sintered at temperatures 200–300 K. lower than with the powders used according to the related art.

Preferably the ceramic powder constitutes more than 40 and less than 50 vol. % of the polymer compound.

Furthermore, the polymer compound preferably additionally has one or more saturated or unsaturated $C_2$–$C_{18}$ carboxylic acids and/or one or more saturated or unsaturated $C_2$–$C_{18}$ alkyl-dimethyl-substituted chlorosilanes and/or one or more saturated or unsaturated $C_2$–$C_{18}$ alkylamines.

The ceramic powder in the polymer compound preferably has a specific surface area of more than $2.5 \cdot 10^8$ m$^2$/m$^3$.

Furthermore, a polymer compound in which the polymer includes a polyolefin, a polyester, or a polyamide as a thermoplast is preferred.

HD polyethylene, LD polyethylene, copolymers of polyethylene with vinyl acetate or butyl acrylate, polypropylene, or polypropylene grafted with acrylic acid or maleic anhydride are preferred as polyolefins.

Polyethylene copolymerized with vinyl acetate has up to 50% vinyl acetate; polyethylene polymerized with butyl acrylate has up to 30% butyl acrylate. Polyethylene grafted with maleic anhydride has 3% maleic anhydride and polypropylene grafted with acrylic acid has 6% acrylic acid.

Polyethylene terephthalate, polybutylene terephthalate, polycarbonate, or polylactone are preferred as polyesters. Polyamide 6, polyamide 12, and polyamide 66 are preferred as polyamides.

Oxides such as $ZrO_2$, $Al_2O_3$, $SiO_2$, MgO, $TiO_2$, $Y_2O_3$, carbides, nitrides, or their mixtures are used as preferred ceramic powders. All kinds of zirconium dioxides, including those containing other metal oxides, are suitable as ceramic powders for the polymer compound. Furthermore, alpha, gamma, and delta aluminum oxides, as well as all simple and complex oxides having a basic or amphoteric surface are suitable, ceramic powders, and particularly preferred is amorphous $SiO_2$ (Aerosil®). When using silicon dioxide, the use of a silane dispergator is particularly preferred. Among carbides, silicon and tungsten carbides are particularly suitable. $Si_3N_4$ and AlN are particularly well-suited as nitrides, an amine being preferably used as a dispergator.

The simple and very quick compounding of the powder into the mixture in a single piece of equipment, the kneader, is particularly advantageous in the method according to the present invention. Another advantage is the possibility of obtaining a heterogeneous material system whose properties are only determined by the interactions of the components at the phase boundary surfaces.

Thermoplasts having a strong tendency to thermomechanical degradation accompanied by predominant or full decomposition are not suitable for use in the method according to the present invention.

Another object of the present invention is a method for manufacturing the polymer compound using a ceramic powder and a thermoplast, the ceramic powder having a specific surface area of more than $1.8 \cdot 10^8$ $m^2/m^3$ and the thermoplast being a shear-resistant polymer kneaded in a kneader with such a high shear force that the pore sizes in the polymer compound are 3–15 nm when the polymer is filled with at least 5 vol. % ceramic powder.

Using the method according to the present invention, even agglomerated powders can surprisingly be disintegrated down to their primary particle sizes, whereby polymer compounds and bodies manufactured thereof with the above-mentioned pore sizes can be manufactured.

In the method according to the present invention, a mixture of an agglomerated ceramic powder having a primary particle size of $\leq 30$ nm and an agglomerated particle size of 1 $\mu m$ or more, a dispergator such as a carboxylic acid and a thermoplast highly resistant to shear forces is processed in a kneader with such high shear forces that the powder is disagglomerated and its primary particles are thereby disintegrated and protected by the dispergator. The dispergator protects the primary particles from re-agglomeration.

Using the method according to the present invention, solid contents of up to 57 vol. % are achieved in the polymer compound. Furthermore, pore sizes of down to 3 nm with a narrow distribution are achieved using the method. These two findings clearly show that the agglomerate has been broken up. Agglomerated powders are normally unsuitable for ceramic process technology and cannot be disagglomerated to this degree using grinding processes of any type.

Using the shearing process applied in the method according to the present invention, the specific surface area of the powder remains the same or is increased. This could be verified using nitrogen adsorption at 77 K by the BET method.

The pore sizes in the blank were measured using $N_2$ desorption or Hg porosimetry. Here it was found that the average pore sizes are smaller by a factor of at least two than the average powder pore sizes measured in the same manner. Furthermore, it was found that they have a narrow monomodal distribution of the pore volume over the pore diameter.

Adding saturated or unsaturated carboxylic acid(s) during compounding as a dispergator results in a chemical reaction of the carboxylic group with the powder surface. In this reaction the carboxylic group is converted into the resonance-stabilized, negatively charged carboxylate group, which is deposited on the positive charge centers of the powder surface, so that an adsorptive ionic bond is obtained. This could be verified via Fourier transform IR spectra for decanoic acid as a dispergator and zirconium dioxide.

In using saturated or unsaturated alkyl dimethyl substituted chlorosilanes as a dispergator, a reaction takes place between the powder surface and the chlorosilanes. The use of dimethyl alkyl chlorosilane as a dispergator for nm-range carbide powder has been found particularly advantageous, the alkyl radical including the $C_{1-C18}$, radical.

The pore sizes in the polymer compound with appropriate filing of the organic component are between 3 and 15 nm. Thus the mobility of the macromolecules is strongly reduced up to a tested temperature of 300° C. This results, in a particularly advantageous manner, in a thermomechanical behavior where the storage modulus of the polymer compound according to the present invention remains virtually constant up to a temperature of 300° C.

The polymer compound manufactured by the method according to the present invention can be used as a starting material for ceramic molding by injection, extrusion, warm or cold pressing, calendering, or rolling. Dense ceramic blanks and, after debindering and sintering, dense ceramic bodies and bodies with definite open and/or closed porosities can be manufactured.

The polymer compounds according to the present invention can be present as molded bodies in the form of string or hollow string of any desired cross-section, a tube, a rectangle, or a sheet. Thus, for example, strings with a diameter of 6 mm to 8 mm, 14 mm×3 mm tubes, 4 mm×5 mm rectangles, and 10 mm×1 mm sheets, in particular, 75 mm×0.5 mm sheets have been manufactured.

Polymer compounds in the form of injection molded bodies or complex three-dimensional bodies can be manufactured.

The polymer compounds according to the present invention are also well-suited as a particle-reinforced plastic.

In addition, the polymer compounds according to the present invention are well-suited as a master batch for manufacturing filled plastics. In particular, functional fillers, for example, for coloring, with dielectric properties (insulators), electrical conductivity, and/or UV adsorption, are used.

Sheets manufactured by the method according to the present invention were found to have the particular advantage of flexibility, which is necessary for printability. In this case normal thick-layer technology is used. When used for printing, it has been found that good compatibility exists with organic systems of the printing pastes, in particular with polyvinyl butyral and high-boiling ether- and ester-based solvents.

The polymer compounds according to the present invention are also well-suited for use as printed circuit board materials.

Previously used printed circuit board materials include aramide fiber-reinforced plastic or fiberglass-reinforced epoxy resins. These materials are, however, not fully satisfactory.

A printed circuit board material having matching thermal expansion coefficients to minimize thermal stresses in integrated components and their electrical contacts was sought. Furthermore, a dielectric material for connection and dielectric planes subsequently applied on FR4 printed circuit board carriers, such as RCC foils (resin-coated copper foils), which equalize the expansion coefficients between the core material and components, is sought. Furthermore, a dielectric material for mounting semi-conductor components on metallic heat sinks with improved heat conductivity and adapted thermal expansion coefficients is sought.

Printed circuit boards manufactured from the polymer compounds according to the present invention achieve these objects through improved thermal conductivity compared to known printed circuit boards, reduction of the thermal stresses as a result of reduced thermal expansion coefficients and, when nanocrystalline amorphous $SiO_2$, is used, also as a particularly readily available and inexpensive embodiment. Thermal expansion coefficients of 0.5 ppm/K and a thermal conductivity of 1.3 W/mK can be achieved.

Reinforcement with nanocrystalline particles can increase the continuous use temperature of simple thermoplasts to approximately 200° C. Even when the polymer contains more than 5 vol. % fillers, the thermal expansion coefficients are lower than those of conventional printed circuit board materials and a good match with the thermal expansion coefficients of chips is achieved. The optimum for this application of the polymer compounds is at a filler content of 40–50 vol. %.

The thermal expansion coefficient of the mixture is greatly reduced by 5–8 ppm/K compared to pure polymer. The stresses occurring due to thermal cycling in mounted components and their contacts are thus minimized.

Furthermore, thermal conductivity is increased compared to pure polymer and compared to printed circuit board materials of the related art.

By using Aerosil®, the continuous use temperature is increased to over 200° C. compared to a pure polymer. Thus the substrate is also resistant to lead-free solder having a higher fusion point, for example.

The polymer compounds according to the present invention are also well-suited as casting compounds for electric or electronic components.

Another advantage of the method according to the present invention and use of the products manufactured using this method is that none of the materials used constitutes a hazard to the environment and each can be used in industrial process without any problems due to their high or nonexistent maximum allowable concentration thresholds.

Examples of Manufacturing of the Polymer Compound

EXAMPLE 1

A mixture of 86.6 wt. % VP-$ZrO_2$ having a specific surface area of 54 $m^2/g$ (=$3.1 \cdot 10^8$ $m^2/m^3$) (manufacturer:Degussa AG), 4 wt. % decanoic acid, and 9.4 wt. % polyethylene vinyl acetate with 28% vinyl acetate was manufactured. This mixture was kneaded for three hours in the Brabender W 350 forced internal mixer. A maximum torque of 350 Nm was measured.

The average pore size in the debindered polymer compound was 8 nm. In the polymer compound the powder was present in a proportion of 50 vol. %.

EXAMPLE 2

A mixture of 83.2 wt. % $ZrO_2$ having a specific surface area of 132 $m^2/g$ (=$7.7 \cdot 10^8$ $m^2/m^3$) (manufacturer: Institut für Neue Materialien, Saarbrücken), 9.5 wt. % decanoic acid, and 7.3 wt. % polyethylene vinyl acetate with 28% vinyl acetate was manufactured. This mixture was kneaded for 90 minutes in the Brabender W 350 forced internal mixer. A maximum torque of 440 Nm was measured.

The average pore size in the debindered polymer compound was 3.5 nm. In the polymer compound the powder was present in a proportion of 43.6 vol. %.

EXAMPLE 3

A mixture of 87.5 wt. % of $ZrO_2$ produced for catalysis having a specific surface area of 35 $m^2/g$ (=$2.0 \cdot 10^8$ $m^2/m^3$), 2.9 wt. % decanoic acid, and 9.6 wt. % polyethylene vinyl acetate with 28% vinyl acetate was manufactured. This mixture was kneaded for 90 minutes in the Brabender W 350 forced internal mixer. A maximum torque of 340 Nm was measured.

The average pore size of the debindered polymer compound was 12 nm. In the polymer compound the powder was present in a proportion of 52 vol. %.

EXAMPLE 4

A mixture of 83.1 wt. % $TiO_2$ P25 having a specific surface area of 50 $m^2/g$ (=$1.9 \cdot 10^8$ $m^2/m^3$) (manufacturer: Degussa AG), 4.4 wt. % decanoic acid and 12.5 wt. % HD polyethylene with a molecular weight of 300,000 g/mol (determined by gel permeation, chromatography) was manufactured. This mixture was kneaded for 80 minutes in the Brabender W 50 forced internal mixer. A maximum torque of 70 Nm was measured.

The average pore size in the debindered polymer compound was 11 nm. In the polymer compound the powder was present in a proportion of 50 vol. %.

Examples of Manufacturing the Molded Body

EXAMPLE 5

The polymer compound manufactured according to Example 1 was molded, after previous granulation in an impact mill or a jaw crusher, in a Brabender extruder having a sheet nozzle. The extruder had a thermoplast conveyor screw with a length/diameter ratio of 25 and a screw diameter of 19 nm. The nozzle used as a molding tool had the dimensions 75 mm×0.55 mm. The cylinder and nozzle temperature was 230° C.

At an extrusion speed of 0.1 to 0.2 m/s, the pressure measured in the discharge zone was $7 \cdot 10^7$ Pa, and the torque measured on the drive was 100 Nm.

EXAMPLE 6

The polymer compound manufactured according to Example 3 was molded in an Arburg 100-injection molding machine having a tool made from two rectangular 4×5×80 $mm^3$ form nest after previous granulation in an impact mill or a jaw crusher. The cylinder temperature was 220° C., tool temperature was 80° C., injection time was 0.6 s, and the dwell pressure time and cooling time were 20 s each. The dwell pressure was $1.2 \cdot 10^8$ Pa.

Another object of the present invention is a method for manufacturing a ceramic sintered body, the polymer compound being debindered and sintered after molding.

The molded bodies made of zirconium dioxide, for example, thus manufactured can be fully compressed at 1100° C. Due to this particularly low sintering temperature compared to the standard powder sintering temperature of 1400° C., novel composites such as sensor elements or electrical components, for example, can now be manufactured using cosintering.

Example of Manufacturing a Ceramic Body from the Polymer Compound

EXAMPLE 7

The polymer compound manufactured according to Example 1 and molded according to Example 5 yielded, after debindering of the organic components, an unsintered ceramic body (blank). A technical shrinkage of 16.4% (linear) occurred after ten hours of sintering at 1100° C. in air. A body having 5% porosity and a purely monoclinic ZrO$_2$ phase component was obtained.

Another object of the present invention is a sintered body which can be manufactured from a polymer compound according to the present invention, from ZrO$_2$ having a tetragonal phase component and a porosity of less than 5%, characterized in that it has less than 0.8 mol-% foreign elements, except hafnium, and less than 90% monoclinic phase.

The method according to the present invention, i.e., combined particle and structure stabilization, yielded a sintered body having a high rupture strength, with a substantial reduction in the proportion of doping substances having been achieved. The novel sintered body could only be obtained by the use of the polymer compound according to the present invention with stabilization of the nanocrystalline raw materials.

The ZrO$_2$ sintered body according to the present invention is considered undoped if it contains less than 0.8 mol-% foreign elements. The average grain size in the sintered structure is less than 100 nm. Different monoclinic components of the material as well as different tetragonal components can be set by varying the sintering conditions. The grain size increases during sintering. The proportion of grains that have exceeded the critical grain size after the body has been cooled and are present in the monoclinic form increases with increasing average grain size. Therefore, the proportion of the monoclinic phase also increases with increasing sintering times and temperature.

The approximately 2 mol-% HfO$_2$ contained in the sintered body is the natural proportion. HfO$_2$ does not act as doping concerning stabilization of the tetragonal phase.

To manufacture undoped, structure-stabilized zirconium dioxide, very fine initial powders having an average grain size of less than 12 nm are used. In their manufacture it must be ensured that the average grain size does not grow during sintering to above 100 nm, which is guaranteed by processing the initial powder by the above-described method according to the present invention.

Examples of manufacturing an undoped, structure-stabilized zirconium dioxide.

EXAMPLE 8

A polymer compound according to Example 2 was manufactured and molded according to Example 5. After debindering the organic components, an unsintered ceramic body was obtained as a blank. A body having a 3% porosity and 30.5% monoclinic phase was obtained from these blanks through sintering for four hours in air at 970° C. The remaining portion of the structure was tetragonal and cubic. The proportion of ZrO$_2$ and HfO$_2$ was more than 99.2 mol-%. The average grain size of the sintered body was 62 nm.

EXAMPLE 9

A polymer compound according to Example 2 was manufactured. After debindering the organic components and sintering for 15 hours in air at 1020° C., a ceramic body was obtained. Its average grain size was 73 nm, with 85.5% monoclinic content. Its density was 5.67 g/cm3. According to the mixing rule, this constitutes 97.3% of the theoretical density.

EXAMPLE 10

A polymer compound according to Example 2 was manufactured. After debindering the organic components and two-hour sintering in air at 970° C., a ceramic body was obtained. It had the density of more than 95% of the theoretical density (5.67 g/cm$^3$). The monoclinic portion was 20.5%. Chemical analysis showed less than 0.8 mol-% foreign elements except hafnium.

What is claimed is:

1. A polymer compound comprising:

a ceramic powder and a polymer, wherein the ceramic powder has a specific surface area of more than 1.8·10$^8$ m$^2$/m$^3$ and is greater than 5 vol. % of the polymer compound, the polymer is shear resistant, and the pore sizes in the polymer compound are 3–15 nm.

2. The polymer compound according to claim 1, wherein the ceramic powder is greater than 40 vol. % of the polymer compound.

3. The polymer compound according to claim 2, wherein the ceramic powder is less than 50 vol. % of the polymer compound.

4. The polymer compound according to claim 1, further comprising:

at least one of at least one saturated or unsaturated C$_2$–C$_{18}$ carboxylic acid, at least one saturated or unsaturated C$_2$–C$_{18}$ alkyl dimethyl substituted chlorosilane, and at least one saturated or unsaturated C$_2$–C$_{18}$ alkylamine.

5. The polymer compound according to claim 1, wherein the ceramic powder has a specific surface area of more than 2.5·10$^8$ m$^2$/m$^3$.

6. The polymer compound according to claim 1, wherein the polymer includes a polyolefin, a polyester or a polyamide as a thermoplast.

7. The polymer compound according to claim 6, wherein the polyolefin is an HD polyethylene, an LD polyethylene, a copolymer of polyethylene with vinyl acetate or butyl acrylate, propylene, or a polypropylene grafted with acrylic acid or maleic anhydride, the polyester is of the polyethylene terephthalate, polybuthylene terephthalate, polycarbonate, or polylactone type, and the polyamide is of the polyamide 6, polyamide 12, or polyamide 66 type.

8. The polymer compound according to claim 1, wherein the ceramic powder contains metal oxides, carbides, nitrides, or their mixtures.

9. The polymer compound according to claim 8, wherein the ceramic powder contains ZrO$_2$, Al$_2$O$_3$, SiO$_2$, TiO$_2$, Y$_2$O$_3$, MgO or their mixtures.

10. The polymer compound according to claim 9, wherein SiO$_2$ is an amorphous SiO$_2$.

11. A method of manufacturing a polymer compound, the method comprising:

mixing a ceramic powder having a specific surface area of more than 1.8·10$^8$ m$^2$/m$^3$ with a thermoplast, wherein the thermoplast is a shear-resistant polymer; and kneading the mixture in a kneader to form a polymer compound, wherein the kneading is done with such a high shear force that the pore sizes in the polymer compound are 3–15 nm when the polymer compound is filled with at least 5 vol. % ceramic powder.

12. The method according to claim 11, wherein the kneading is performed together with at least one of at least one saturated or unsaturated C$_2$–C$_{18}$ carboxylic acid, at least one saturated or unsaturated C$_2$–C$_{18}$ alkyl dimethyl substituted chlorosilane, and at least one saturated or unsaturated C$_2$–C$_{18}$ alkylamine.

13. A starting material for ceramic molding by injection molding, extrusion, warm or cold pressing, or rolling, the starting material comprising:

the polymer compound according to claim 1.

14. The starting material according to claim 13, wherein strings or hollow strings of any desired cross-section or sheets are produced as molded bodies in extrusion, and complex three-dimensional bodies are produced in the injection molding process.

15. A particle-reinforced plastic comprising:

the polymer compound according to claim 1.

16. A master batch for manufacturing filled plastics, the master batch comprising:

the polymer compound according to claim 1.

17. A printed circuit board material comprising:

the polymer compound according to claim 1.

18. A casting compound for electrical or electronic components, the casting compound comprising:

the polymer compound according to claim 1.

19. A method of manufacturing a ceramic sintered body, the method comprising:

mixing a ceramic powder having a specific surface area of more than $1.8 \cdot 10^8$ m$^2$/m$^3$ with a shear-resistant polymer;

kneading the mixture in a kneader to form a polymer compound, wherein the kneading is done with such a high shear force that the pore sizes in the polymer compound are 3–15 nm when the polymer compound is filled with at least 40 vol. % ceramic powder;

molding the polymer compound;

debindering the polymer compound; and sintering the polymer compound to form a ceramic sintered body.

20. A sintered body manufactured according to the method of claim 19, wherein the ceramic powder is ZrO$_2$ having a tetragonal phase component and a porosity of less than 5%, and the sintered body has less than 0.8 mol-% foreign atoms, except hafnium, and a monoclinic phase component of less than 90%.

* * * * *

UNITED STATES PATENT AND TRADEMARK OFFICE
CERTIFICATE OF CORRECTION

PATENT NO. : 6,518,323 B1  Page 1 of 1
DATED : February 11, 2003
INVENTOR(S) : Scheyeing et al.

It is certified that error appears in the above-identified patent and that said Letters Patent is hereby corrected as shown below:

Column 2,
Line 22, delete "Detailed Description".
Line 27, insert -- Detailed Description --.
Line 57, change "such as $Z_rO_2$" to -- such as, for example, $Z_rO_2$ --.
Line 57, change "$T_iO_2$, $Y_2O_3$" to -- $T_iO_2$ and $Y_2O_3$ --.
Line 64, change "suitable, ceramic" to -- suitable as ceramic --.

Column 4,
Line 4, change "$C_{1-C18}$ radical" to -- $C_1$-$C_{18}$ radical --.

Signed and Sealed this

Second Day of March, 2004

JON W. DUDAS
*Acting Director of the United States Patent and Trademark Office*